US008801856B2

(12) United States Patent
Burrows et al.

(10) Patent No.: US 8,801,856 B2
(45) Date of Patent: Aug. 12, 2014

(54) METHOD AND SYSTEM FOR HIGH-THROUGHPUT DEPOSITION OF PATTERNED ORGANIC THIN FILMS

(75) Inventors: Paul E. Burrows, Kennewick, WA (US); Jeffrey Silvernail, Yardley, PA (US); Julie J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 1014 days.

(21) Appl. No.: 12/874,368

(22) Filed: Sep. 2, 2010

(65) Prior Publication Data

US 2011/0059259 A1 Mar. 10, 2011

Related U.S. Application Data

(60) Provisional application No. 61/240,638, filed on Sep. 8, 2009.

(51) Int. Cl.
*C23C 16/00* (2006.01)
*C23C 16/52* (2006.01)
*H01L 21/312* (2006.01)

(52) U.S. Cl.
USPC ........... 118/715; 137/563; 137/597; 137/861; 156/345.33; 156/345.34

(58) Field of Classification Search
USPC .................. 137/597, 563, 861, 888; 118/715; 156/345.33, 345.34; 406/1; 239/433, 239/569
See application file for complete search history.

(56) References Cited

U.S. PATENT DOCUMENTS

| | | | | |
|---|---|---|---|---|
| 2,588,255 A * | 3/1952 | Larsh | 239/310 |
| 2,795,370 A * | 6/1957 | Camp | 417/181 |
| 3,192,939 A * | 7/1965 | Moen | 137/100 |
| 3,930,908 A | 1/1976 | Jolly | |
| 4,788,082 A | 11/1988 | Schmitt | |
| 5,256,205 A | 10/1993 | Schmitt, III et al. | |
| 5,356,673 A | 10/1994 | Schmitt, III et al. | |
| 5,421,888 A | 6/1995 | Hasegawa | |
| 5,554,220 A | 9/1996 | Forrest et al. | |
| 5,595,606 A | 1/1997 | Fujikawa et al. | |
| 5,650,197 A | 7/1997 | Halpern | |

(Continued)

FOREIGN PATENT DOCUMENTS

| | | |
|---|---|---|
| EP | 0173715 | 4/1992 |
| GB | 2336553 | 10/1999 |

(Continued)

OTHER PUBLICATIONS

CRC Handbook of Chemistry and Physics, 54th Ed., CRC Press, 1973, p. E-225.

(Continued)

*Primary Examiner* — Stephen M Hepperle
*Assistant Examiner* — Seth W Mackay-Smith
(74) *Attorney, Agent, or Firm* — Sterne, Kessler, Goldstein & Fox P.L.L.C.

(57) ABSTRACT

High-throughput OVJP systems and methods are provided that may use multiple flow paths having different conductances to enable deposition with relatively short lag times. A high-throughput OVJP system may include a flow tube having a cross-sectional area much larger than the diameter of one or more apertures through which source material may be expelled during deposition. Use of such a configuration may allow for deposition with reduced lag times.

25 Claims, 4 Drawing Sheets

440
425
430
435
520
445
450
420
455
415

(56) References Cited

U.S. PATENT DOCUMENTS

| | | | | |
|---|---|---|---|---|
| 5,707,745 | A | 1/1998 | Forrest et al. | |
| 5,720,821 | A | 2/1998 | Halpern | |
| 5,759,634 | A | 6/1998 | Zang | |
| 5,844,363 | A | 12/1998 | Gu et al. | |
| 6,037,241 | A | 3/2000 | Powell et al. | |
| 6,048,630 | A | 4/2000 | Burrows et al. | |
| 6,056,823 | A | 5/2000 | Sajoto et al. | |
| 6,065,492 | A | 5/2000 | Bergamini | |
| 6,066,357 | A | 5/2000 | Tang et al. | |
| 6,165,554 | A | 12/2000 | Halpern et al. | |
| 6,190,732 | B1 | 2/2001 | Omstead et al. | |
| 6,303,238 | B1 | 10/2001 | Thompson et al. | |
| 6,337,102 | B1 | 1/2002 | Forrest et al. | |
| 6,482,266 | B1 | 11/2002 | Matsumoto et al. | |
| 6,537,607 | B1 | 3/2003 | Swanson | |
| 6,572,706 | B1 | 6/2003 | Nguyen et al. | |
| 6,660,126 | B2 * | 12/2003 | Nguyen et al. | 156/345.34 |
| 6,716,656 | B2 | 4/2004 | Shtein et al. | |
| 6,962,624 | B2 | 11/2005 | Jurgensen et al. | |
| 7,279,704 | B2 | 10/2007 | Walters et al. | |
| 7,334,599 | B2 * | 2/2008 | Shieh | 137/119.05 |
| 7,381,943 | B2 * | 6/2008 | Lee et al. | 250/251 |
| 7,404,862 | B2 * | 7/2008 | Shtein et al. | 118/726 |
| 7,431,968 | B1 * | 10/2008 | Shtein et al. | 427/255.6 |
| 7,537,018 | B1 * | 5/2009 | Curran et al. | 137/3 |
| 2003/0054099 | A1 | 3/2003 | Jurgensen et al. | |
| 2003/0054100 | A1 | 3/2003 | Eser et al. | |
| 2003/0087471 | A1 | 5/2003 | Shtein et al. | |
| 2006/0115585 | A1 * | 6/2006 | Bulovic et al. | 427/180 |
| 2008/0152806 | A1 * | 6/2008 | Forrest et al. | 427/255.26 |
| 2010/0097416 | A1 | 4/2010 | Yoo et al. | |

FOREIGN PATENT DOCUMENTS

| | | |
|---|---|---|
| JP | 63307255 | 12/1988 |
| WO | WO 99/25894 | 5/1999 |
| WO | WO 01/61071 | 8/2001 |
| WO | WO 02/27064 | 4/2002 |
| WO | WO 2011/031631 A1 | 3/2011 |

OTHER PUBLICATIONS

S.R. Forrest, "Ultrathin Organic films grown by organic molecular beam deposition and related techniques", Chem. Rev., 97(6):1793-1896 (Sep./Oct. 1997).

S. Wolf and R. N. Tauber, Silicon Processing for the VLSI Era, vol. 1: Process Technology, pp. 73-123 (Lattice, 1986).

M. A. Baldo, et al., "Organic Vapor Phase Deposition", Adv. Mater., 10(18):1505-1514 (1998).

G. B. Stringfellow, Organometallic Vapor-Phase Epitaxy: Theory and Practice, pp. 55-283 (Academic, London, 1989).

G. H. Olsen, "Vapour-phase Epitaxy of GaInAsP", GaInAsP Alloy Semiconductors, edited by T. P. Pearsall (Wiley, New York, 1982), pp. 11-41.

P. E. Burrows, et al., "Organic Vapor Phase Deposition: a new method for the growth of organic thin films with large optical non-linearities", J Cryst. Growth, 156:91-98 (1995).

K. M. Vaeth, et al., "Chemical vapor deposition of poly (p-phenylene vinylene) based light emitting diodes with low turn-on voltages", Appl. Phys. Lett. 71(15):2091-2093 (Oct. 13, 1997).

M. A. Baldo, et al., "Low pressure organic vapor phase deposition of small molecular weight organic light emitting device structures", Appl. Phys. Lett., 71(21):3033-3035 (Nov. 24, 1997).

M. Shtein, et al., "Material transport regimes and mechanisms for growth of molecular organic thin films using low-pressure organic vapor phase deposition", J Appl. Phys., 89(2):1470-1476 (Jan. 15, 2001).

S. Krumdieck, "Kinetic Model of Low Pressure Film Deposition From Single Precursor Vapor in a Well-Mixed, Cold-Wall Reactor", Acta mater., 49:583-588 (2001).

R.B. Bird, et al., Transport Phenomena, New York, John Wiley & Sons, Inc., pp. 508-513 (1960).

Forrest et al., "Intense Second Harmonic Generation and Long-Range Structural Ordering in Thin Films of Organic Salt Growth by Organic Vapor Phase Deposition," Appl. Phys. Lett., 68:1326-1328 (1996).

Shtein et al., "Effects of Film Morphology and Gate Dielectric Surface Preparation on the Electrical Characteristics of Organic Vapor Phase Deposited Pentacene Thin-Film Transistors," Appl. Phys. Lett., 81:268-270 (2002).

Shtein et al., "Micron scale patterning of organic thin films via organic vapor phase deposition", Presentation Outline from the Mat. Res. Soc. Ann. Meeting 2001, Boston.

Shtein et al., "Micropatterning of small molecular weight organic semiconductor thin films using organic vapor phase deposition", J. Appl. Phys., 93(7):4005-4016 (Apr. 1, 2003).

Zhang et al., Jet Vapor Deposition of Nanostructure Composite Materials, Materials Res. Soc. Symp. Proc., Mater. Res. Soc. Symposium Proc. 1193, 286, pp. 385-389.

Supplementary European Search Report from EP 0 277 0461 dated Jun. 12, 2007.

Sybil P. Parker, ed., McGraw-Hill Dictionary of Scientific and Technical Terms, Fifth Edition, p. 1516 (1994).

ASTM, Compilation of ASTM Standard Definitions, Eighth Edition, p. 380 (1994).

Search Report corresponding to the PCT/US2010/047780 application.

Yiru et al., "Direct patterning of organic light-emitting devices by organic-vapor jet printing" Applied Physics Letters, AIP, American Institute of Physics, Melville, NY, vol. 86, No. 11, Mar. 8, 2005, p. 113504.

* cited by examiner

FIG. 4A
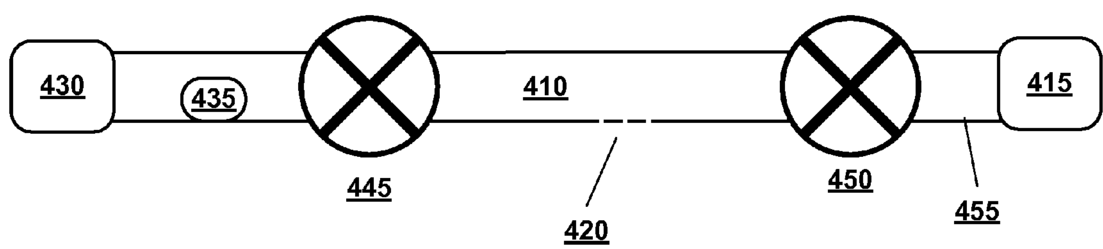
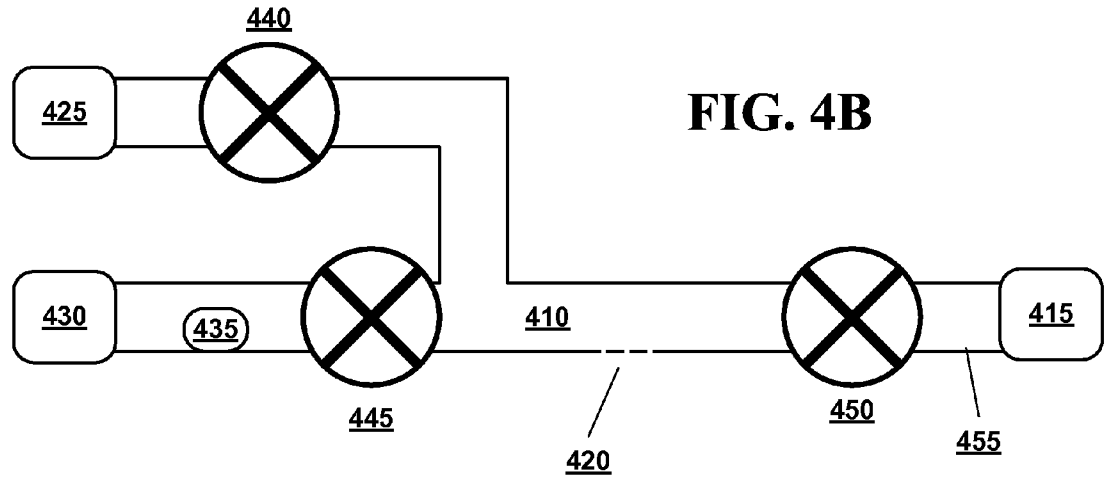
FIG. 4B

METHOD AND SYSTEM FOR HIGH-THROUGHPUT DEPOSITION OF PATTERNED ORGANIC THIN FILMS

CROSS-REFERENCE TO RELATED APPLICATIONS

This application claims priority to U.S. Provisional Application No. 61/240,638, filed Sep. 8, 2009, the disclosure of which is incorporated by reference in its entirety.

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

FIELD OF THE INVENTION

The present invention relates to the deposition of organic thin films and, more specifically, to methods and systems for depositing organic thin films with reduced lag time and/or increased deposition efficiency.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

More details on OLEDs, and the definitions described above, can be found in U.S. Pat. No. 7,279,704, which is incorporated herein by reference in its entirety.

SUMMARY OF THE INVENTION

High-throughput organic vapor jet printing (OVJP) systems and methods are provided that may use multiple flow paths having different conductances to enable deposition with relatively short lag times. A high-throughput OVJP system may include a flow tube having a cross-sectional area much larger than the diameter of one or more apertures through which source material may be expelled during deposition.

For example, a high-throughput OVJP device or system may include an enclosure such as a flow tube having a first end, a second end, and at least one aperture disposed between the first end and the second end, a source of organic molecules in fluid communication with the enclosure, a source of carrier gas in fluid communication with the source of organic molecules, a bypass valve, a first flow path from the source through the bypass valve, and a second flow path from the source through the at least one aperture. The second flow path may be from the organic source through multiple apertures in the enclosure. Each aperture may have a width of at least about 5 to 10 μm, to about 100 μm. Each aperture may have cross-sectional area of about 3000 $\mu m^2$ or less. The apertures may have a total cross-sectional area of about $3\times10^5$ $\mu m^2$ to about $3\times10^6$ $\mu m^2$. The cross-sectional area of the enclosure may be much greater than the cross-sectional area of the apertures, and may be at least about 100 times the total cross-sectional area of the enclosures. The conductance of the first flow path may be at least about 100, 200, 500, 1000 times the conductance of the second flow path when the bypass valve is open or more, i.e., the conductance ratio between the first and second flow paths may be 100:1, 200:1, 500:1, 1000:1, or more. The conductance of the first flow path may be zero or approximately zero when the bypass valve is closed. The source of organic molecules may be disposed closer to the first end of the enclosed volume than the second end, and the bypass valve may be disposed at the second end of the enclosed volume. One or more nozzles may be connected to the at least one aperture in the enclosure. The nozzles may be more than about 0.1 cm, more than about 0.5 cm, or in the range of about 0.1 to 1 cm in length. When the bypass valve is open, at least 95% or more, or substantially all organic molecules produced by the source may follow the first flow path. When the bypass valve is closed, 95% or more, or substantially all organic molecules produced by the source may follow the second flow path. The system may include a vacuum source in fluid communication with the second end of the enclosure. The system may include a blocking mechanism moveable from a first position in which the blocking mechanism covers the at least one aperture to a second position in which the at least one aperture is uncovered. The blocking mechanism may include, for example, at least one shutter, where each shutter is arranged to cover at least one aperture. The OVJP system or device may have a relatively short lag time, for example, of not more than about 1 second or 1 minute when operated.

Methods of operating an OVJP system or device may include opening the bypass valve to cause the carrier gas flow to transport organic material from the source through a first flow path from the source through the bypass valve, the first flow path having a first conductance when the bypass valve is open, and closing the bypass valve to cause the carrier gas flow to transport organic material through a second flow path from the source through the at least one aperture, the second flow path having a second conductance, where the first conductance is at least about 100, 200, or 500 times the second conductance. The system may include any or all of the features previously described.

BRIEF DESCRIPTION OF THE DRAWINGS

FIG. 4A shows a schematic diagram of an example high-throughput OVJP system.

FIG. 4B shows a schematic diagram of an example high-throughput OVJP system with a dilution valve and flow path.

FIG. 5A shows a schematic diagram of an example high-throughput OVJP system in a deposition mode.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
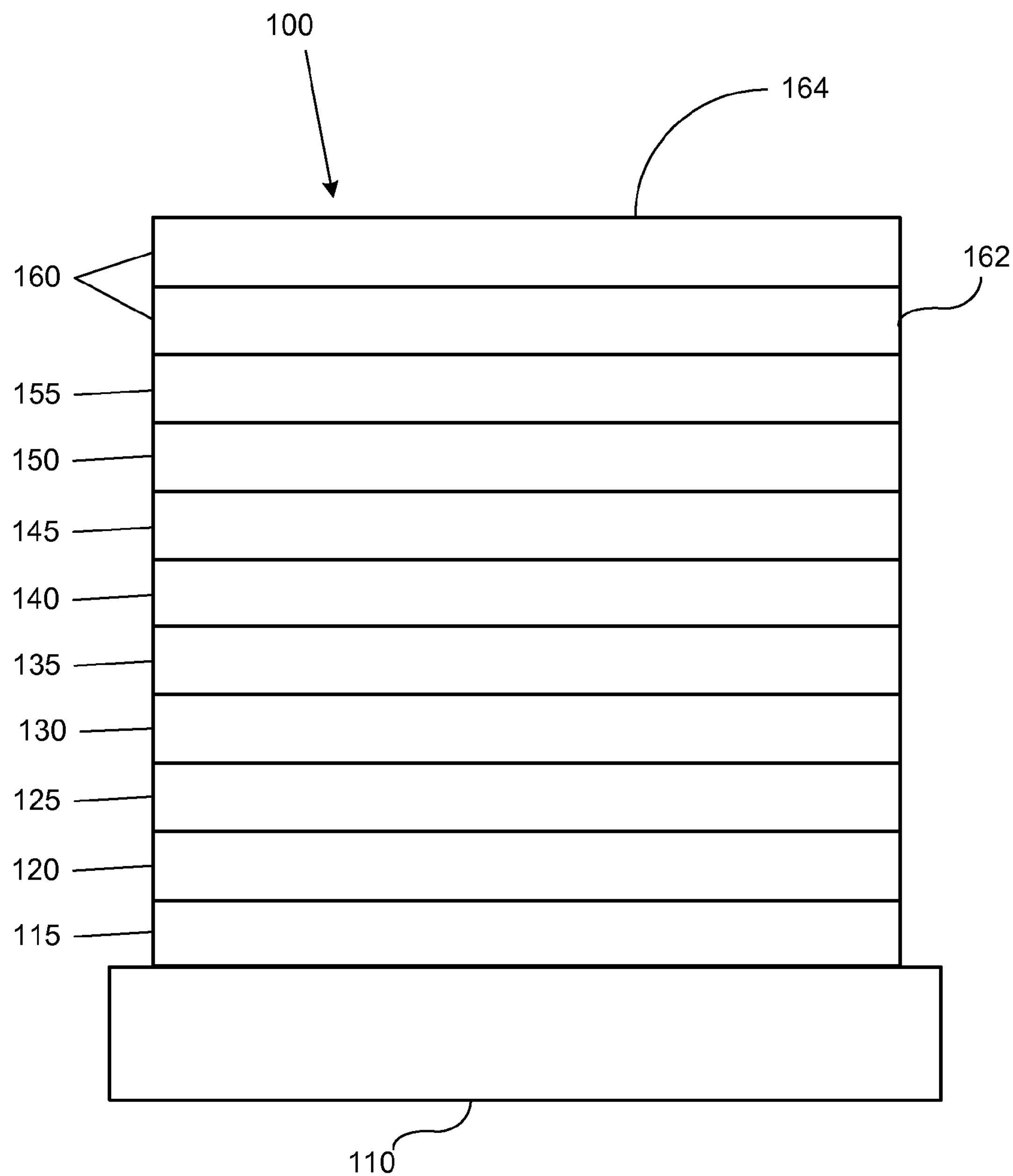
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
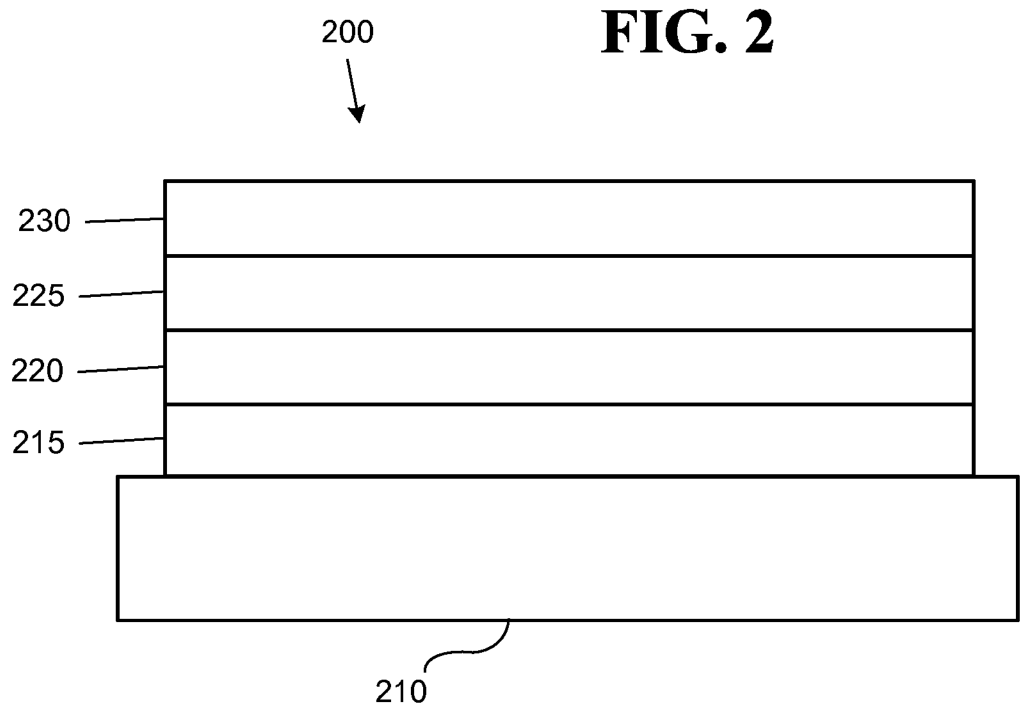
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. Nos. 7,404,862 and 7,431,968, each of which is incorporated by reference in its entirety, and U.S. Patent Publication No. 2005/0087131 to Shtein et al., which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet, OVJD, and/or OVJP. Other methods may also be used. The materials to be deposited may be modified to make them compatible with a particular deposition method.

OVJP techniques may be used in a variety of applications, including the deposition of various layers in an OLED or other organic device. Some OVJP systems use a deposition process that includes the steps of 1) heating an organic material in a crucible, causing it to evaporate, 2) passing an inert carrier gas such as nitrogen over the hot organic material, thereby entraining organic vapor within the carrier gas, and 3) flowing the carrier gas with the organic vapor down a tube, where it is ejected onto a substrate via a nozzle to form a thin, laterally patterned organic film. For example, a series of pixels or other raised features may be deposited on a substrate, and may be patterned across a plane parallel to the substrate. It has now been found that this process of entraining, transporting and ejecting the organic molecules can lead to a sub-optimal or unacceptably high "lag time." As used herein, the "lag time" of an OVJP system refers to the delay between the time when the system is first placed in a deposition mode or configuration, and the time at which the system reaches an equilibrium state sufficient to output or deposit organic material at a constant or substantially constant rate. In some configurations, the "lag time" may be equivalent to the delay between the time when the flow rate of the carrier gas or temperature of the organic is changed and the time when the deposition rate at the nozzle stabilizes at a new value in response to the change. In general, lag time may increase as the length of the transport line is increased, or if the diameter of the transport line or of the nozzle is decreased. Further, the organic material also may be maintained at a relatively high temperature when in isolation (i.e., between two valves) in between deposition runs, during which time the pressure in the source chamber may become equal to the vapor pressure of the source material at the source temperature. To begin deposition, the valves are quickly opened to the flow tube, which is typically at a lower pressure. This may result in a rapid pressure drop in the source vessel and rapid expansion and cooling of the organic vapor. This may lead to significant transients in the deposition rate from the nozzle.

To limit these undesirable transients, a high-throughput OVJP system as described herein may allow for rapidly switching the flow of vapor through the system from the deposition output to a bypass system, while incurring few or no transients.

Figure 3:
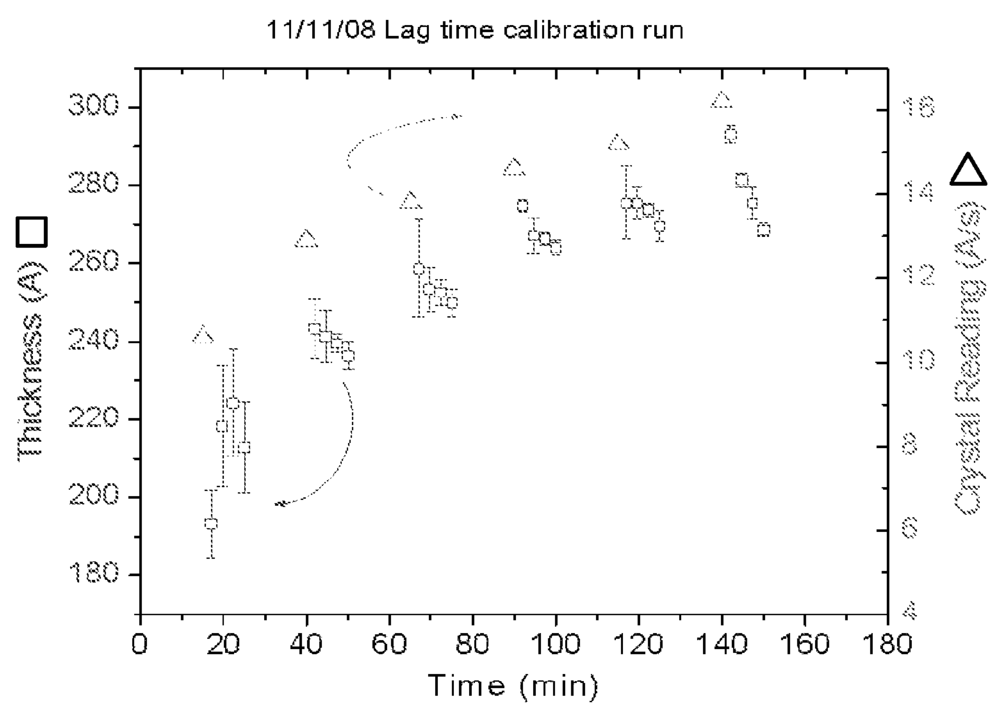
FIG. 3 shows a plot of film thickness over time for experimental deposition using a nozzle with a diameter of 1 mm.

As an example, OVJP techniques may be used to deposit pixel structures, such as for high-resolution displays where it may be necessary to start and stop the flow of organic material multiple times per display or deposition run. Some uses may require or benefit from relatively small nozzles, such as nozzles having outlets not more than about 30 μm in diameter or smaller. However, a small nozzle may significantly restrict the flow of gas through the nozzle and, therefore, through the OVJP flow tube, which can worsen the lag times in operation of the system. For example, FIG. 3 shows film thickness over time for experimental deposition using a nozzle with a diameter of 1 mm. As shown, even for a relatively large 1 mm diameter nozzle, the system can take over two hours to reach an equilibrium state in which the rate of deposition is acceptably high and relatively constant.

In some cases it may be desirable to use nozzles less than 1 mm in diameter. However, smaller diameter nozzle may further decrease the conductance from the source to the nozzle, resulting in relatively very long lag times which may render the system inefficient or unsuitable for high resolution deposition. Small nozzles also may cause relatively low carrier gas flow rates, which can allow diffusion of organic vapor against the gas flow and source cross-contamination.

To reduce or eliminate these problems, a high-throughput OVJP system that provides a relatively very high conductance path from the organic source to one or more relatively small deposition apertures may be used. An example of a high-throughput OVJP system is shown in FIG. 4A. The system may include an enclosure 410 in fluid communication with a high throughput pump or other vacuum source 415, which may be separated from the enclosure 410 by a bypass valve 450. The enclosure 410 may be referred to as a flow tube, though it will be understood that the enclosure need not be cylindrical or have a constant or uniform cross-section. For example, a preferred shape for the enclosure 410 may be a shape having a semi-cylindrical cross section or another cross-section that includes a substantially flat portion. A source 435 may be disposed at one end of the enclosure 410, and a bypass valve 450 at the other end. The bypass valve may direct or allow a flow of material to the pump 415 when open, and obstruct or prevent flow to the pump 415 when closed. A carrier gas flowing through a mass flow controller 430 may transport source molecules from one or more sources 435 may flow down the enclosure 410 when the pump 415 is activated and the source valve 445 is open. The system also may include one or more mass flow controllers 430 to control a carrier gas flow through the enclosure 410. The enclosure 410 may include one or more relatively small apertures 420 through which the source material may be ejected for deposition on a substrate. The apertures may be relatively small, for example, not more than about 5-10 μm in diameter or width, or not more than about 18-75 $\mu m^2$ in area. In general, each aperture may have a width anywhere in the range of about 5 to about 100 μm. The width may be a diameter, such as where round or circular apertures are used, or it may be a longest or other dimension of the aperture, such as where square or rectangular apertures are used. In a preferred configuration, the enclosure 410 may include a flat or substantially flat portion in which the apertures are disposed, which may be disposed parallel to a substrate on which organic material is to be deposited. It may be preferred for the apertures 420 to include a linear array of apertures, since such a configuration may allow for a substrate to be moved relative to the apertures for deposition of a two-dimensional array of material. Although illustrated as straight, it will be understood by one of skill in the art that the enclosure 410 may be curved, straight, or any combination thereof. It may be preferred that the portion of the enclosure 410 proximate to the substrate is substantially or completely parallel to the substrate, and/or substantially or completely planar. The flow tube may have various cross-sections, though it may be preferred that the edge containing the apertures 420 is substantially flat. The enclosure 410 may have a section with relatively thin walls in the region that includes the apertures 420. A cold plate 455 or other chilled surface may be disposed between the bypass valve and the pump to collect excess organic material to be collected or recycled back into the system.

FIG. 4B shows another example of a high-throughput OVJP system that includes a gas inlet controlled by a dilution valve 440 and a mass flow controller 425. The dilution valve 440 may be used to control concentration of the source material in the flow of carrier gas in the flow tube 410, and may be operated concurrently with the source control valve 445. As described herein, unless indicated otherwise it will be understood that the dilution branch of the system, including the dilution mass volume controller 425 and dilution valve 440, may be operated concurrently with or to enhance operation of the source flow, or may be omitted entirely.

A method of operating a high-throughput OVJP system such as the example systems illustrated in FIGS. 4A and 4B may include activating the pump 415 and opening the bypass valve 450 and the source valve 445. In this configuration, a flow path from the source 435 through the bypass valve 450 may have a much higher conductance than a flow path from the source through the one or more apertures 420 and, therefore, relatively very little material, preferably substantially no material or no material, may flow through the apertures 420. A carrier gas and transported vapor may traverse the flow tube 410 through the source valve 445 and bypass valve 450. The bypass valve 450 may then be closed, causing the carrier gas and transported material to follow a flow path through the apertures 420, after which the material may deposit on a substrate. As described in further detail below, when the bypass valve 450 is open, the conductance of the flow path from the source through the bypass valve may be much greater than the conductance of a flow path from the source through the apertures. The conductance of the source-bypass valve flow path may be at least 100, 200, 500, or 1000 times the conductance of the source-aperture flow path. As a result, little or no carrier gas and source material will flow through the apertures when the bypass valve is open. Preferably, when the bypass valve is open at least about 95%, more preferably substantially all or about 100% of the organic molecules produced by the source and/or transported by the carrier gas follow the flow path through the bypass valve. Similarly, when the bypass valve is closed, preferably at least about 95%, more preferably substantially all or about 100% of transported organic molecules follow the flow path through the at least one aperture.

As used herein, a "flow path" refers to a path that may be followed by a gas, such as a carrier gas, and other materials carried within the flow of the gas, such as molecules of a source material being transported by the gas. A flow path may include multiple specific paths that a particular gas molecule or other physically-separate entity may traverse, such as where a flow path includes individual paths through a plurality of adjacent apertures. A particular flow path has an associated conductance, which indicates the ease with which a gas or other flow may traverse the flow path. The conductance of a flow path may be roughly proportional to the smallest cross-sectional area through which the flow path passes. For a flow path that includes paths through multiple relatively closely-spaced apertures, such as a plurality of apertures in the same surface, the apertures may be considered a single cross-sectional area through which the flow path passes. In this case, the total cross-sectional area of the apertures may be treated as a single cross-sectional area through which the flow passes for purposes of determining the conductance of the flow path.

Figure 5A:
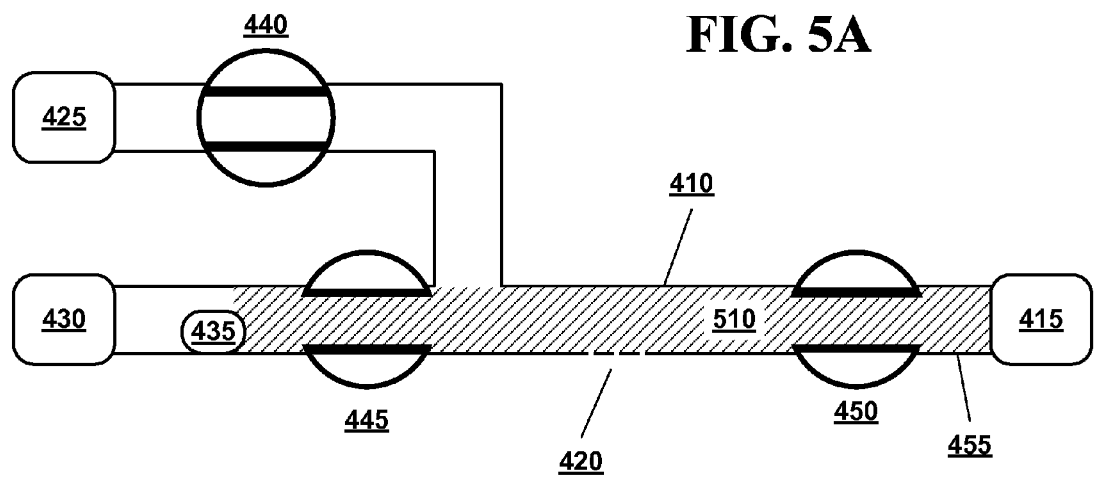
FIG. 5A shows a schematic diagram of an example high-throughput OVJP system in a charging mode.

A specific example of a method of operating a high-throughput OVJP system is illustrated in FIG. 5. FIG. 5A shows a high-throughput OVJP system in a first, or bypass mode in which the bypass valve is open and the carrier gas is flowing. Carrier gas and organic vapor may rapidly fill the flow tube and continually traverse a flow path 510 (shaded region) from the carrier gas source and the organic source through the bypass valve, until a dynamic equilibrium is reached. Because of the large conductance differential between the bypass valve 450 and the apertures 420, little or no material may pass through the apertures. The substrate may be disposed or moved away from the apertures during this phase, or a blocking mechanism may be used to completely prevent any movement of carrier gas and organic vapor through the apertures. For example, a cover, shutters, plugs, caps, or other mechanism can be disposed over or within the apertures to completely block the flow of gas through the apertures, and thereby eliminate deposition. The blocking mechanism may include micromechanical components, such as where micromechanical shutters are used. A single device may be used to cover multiple apertures, or the blocking mechanism may include multiple devices, each of which covers one or more apertures. For example, individual shutters may be used to cover each aperture, or a single cap or shutter may be used to cover multiple apertures. The blocking mechanism may be heated to prevent condensation.

Figure 5B:
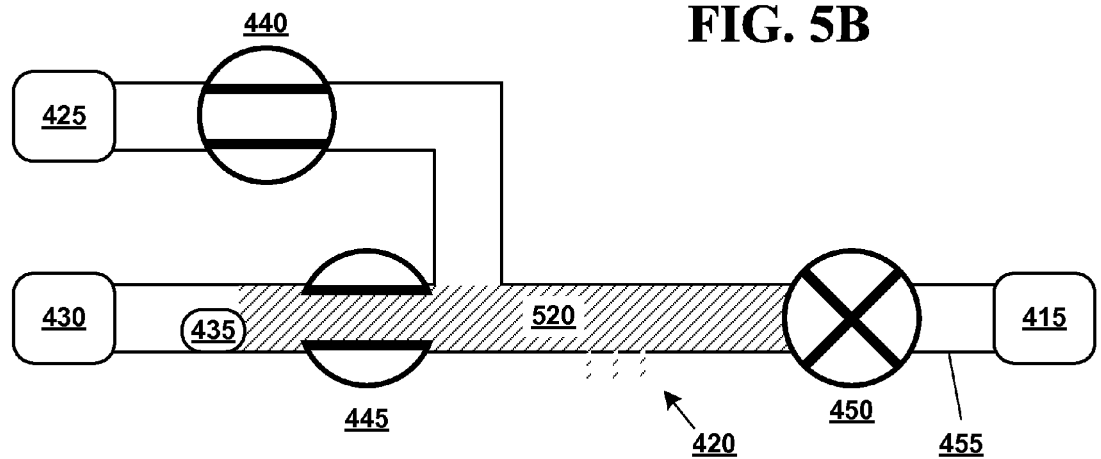

FIG. 5B shows the OVJP system illustrated in FIG. 5A during operation in a deposition mode. In this mode, the bypass valve may be closed and organic vapor and carrier gas may follow a flow path 520 from the source through the apertures 420, after which the source material may deposit on a substrate. It may be desirable to reduce the carrier gas flow rate when the bypass valve is closed to maintain a constant or substantially constant pressure in the flow tube.

It will be noted that, in contrast to other OVJP systems, a high-throughput OVJP system as shown in FIGS. 4 and 5 may exclude a long vapor delivery line, such as between the flow tube 410 and a nozzle disposed above a substrate. Such a vapor delivery line would restrict the flow of vapor down the delivery line and may result in undesirable pressure transients and other effects when the source is first opened to the vapor stream, such as by opening the associated valve 445.

By switching between a charging mode and a deposition mode as illustrated in FIGS. 5A and 5B, respectively, the flow tube may be filled, or "charged" with different organic materials as needed. This may allow for the system to deposit lines of organic thin film corresponding to the positions of the apertures in the tube, for example, by moving a substrate in a direction parallel to the flow tube and adjacent to the apertures.

In some configurations, one or more nozzles may be attached to the one or more apertures 420. As used herein, a "nozzle" refers to a mechanism that directs, guides, or otherwise controls the flow of material after it exits the one or more apertures 420. A nozzle may be, for example, a relatively short tube aligned with an aperture. A nozzle may have a constant cross-sectional area, such as a uniform tube, or it may have a non-uniform cross-sectional area. For example, the cross-sectional area may decrease proportional to the distance from the flow tube. A nozzle having a decreasing diameter and/or cross-sectional area may be referred to as a "tapered nozzle." A nozzle may have a cross-sectional area less than the aperture to which the nozzle is attached, in which case a flow path that includes a region within the nozzle may be at least partially defined by the cross-sectional area of the nozzle. In general, it may be preferred for each nozzle used in a high-throughput OVJP system to have a minimum length. As used herein, the length of a nozzle refers to the additional distance a flow must traverse to exit the nozzle, after exiting the aperture in the flow tube to which the nozzle is attached. Nozzles used in a high-throughput OVJP system as described herein may have minimum lengths of about 0.1, 0.5 cm, or any intervening length. In general, it may be preferred for the nozzle to be sufficiently short so as not to incur additional lag time. For example, it may be preferred for the nozzle to be not more than about 1 cm. In some configurations, it may be preferred for the nozzle to be not longer than about 10 times the diameter of the nozzle. Various combinations of nozzles may be used with the one or more apertures. For example, when multiple apertures are used, a single nozzle may be attached to each aperture, or a nozzle may be attached to one or more apertures such that a flow path through the nozzle may include flow paths through multiple apertures. In some configurations, nozzles and nozzle geometries such as those described in U.S. application Ser. No. 12/729,479, entitled "Compact Organic Vapor Jet Printing Print Head" and filed Mar. 23, 2010, and/or in U.S. application Ser. No. 12/729,448, entitled "Nozzle Geometry for Organic Vapor Jet Printing" and filed Mar. 23, 2010 may be used. The disclosure of each of these applications is incorporated herein by reference in its entirety.

A high-throughput OVJP system as described herein may be operated with relatively short lag times in contrast to other OVJP systems that may have substantial lag due to the slow rate of travel of organic vapor from the source to the deposition zone. It is believed that a high-throughput OVJP system as described herein may achieve a lag time of not more than about 1 minute, and preferably not more than about 1 second, although other lag times may be acceptable depending on the specific configuration or application for which a particular system is used.

In general, the flow tube may be as wide as is practical given other physical constraints, such as operating space, of the OVJP system. Preferably, the flow tube has a cross-sectional area sufficient to maintain a desired conductance ratio between the bypass and deposition flow paths. For example, in a system having an array of 100 nozzles, each with an aperture having a cross-sectional area of about 750 $\mu m^2$, it may be desirable for the flow tube to have a cross-sectional area of about $3.75\times10^7$ $\mu m^2$ so as to maintain a conductance ratio of about 500:1. As another example, in a configuration having 100 square apertures, each with a width of about 30 μm, a flow tube with a cross-sectional area of at least about $4.5\times10^7$ $\mu m^2$ may be used to maintain a conductance ratio of about 500:1. Conductance ratios of 1000:1 or more also may be used. It will be understood that this example is provided as an illustration and other configurations may be used, such as where a different number or different size nozzles are used. Generally, the flow tube may have a cross-sectional area in the range of about 1500 $\mu m^2$ to about $5\times10^7$ $\mu m^2$ or more. As a specific example, a system configured to deposit a display with 1000 lines may use a flow tube equivalent to a 21 mm tube, or having a cross-sectional area of about 1150-1200 $mm^2$. The entire structure of the OVJP system or portions thereof may be miniaturized, such as by etching into silicon or other appropriate materials using MEMS, microfluidic and/or other fabrication schemes as known to those of skill in the art.

In each mode illustrated in FIGS. 5A-B, the dilution valve may be opened or closed and a dilution gas provided into the system to adjust the concentration of organic material output by the system. Unless specifically indicated otherwise, the use of a dilution source and associated valve does not have a substantial effect on the flow regimes or the differences between different flow regimes as described herein. The general use and operation of a dilution source in the OVJP systems and methods described herein will be readily appreciated by one of skill in the art.

Various components and portions of a high-throughput OVJP system as described herein may be heated to prevent condensation on the components. For example, referring to FIGS. 4-5, any or all of the source valve 445, bypass valve 450, and enclosure 410 may be heated. The enclosure 410 may be heated non-uniformly, such as where it is heated to produce a temperature gradient within the enclosure.

As previously described, a flow path may pass through a plurality of apertures in a single surface. For example, in a high-throughput OVJP system as described herein, a flow path may pass through a plurality of relatively small apertures in a flow tube. For purposes of estimating or calculating the conductance of such a flow path, the apertures may be treated a single aperture having a cross-sectional area equal to the sum of the cross-sectional areas of the individual apertures. In general, this approximation technique will be more accurate as the apertures are more closely-spaced, such that the flow of gas through the apertures is not substantially affected by the intervening material.

The one or more apertures described with respect to FIGS. 4-5, as well as any nozzles attached thereto, may have dimensions selected to match or produce desired features in a film of organic material deposited on a substrate. For example, an OVJP system as described herein may be used to deposit a plurality of independent, physically separate features within an organic film, such as pixels for a display or other light-emitting device. The apertures and resulting features may have widths or diameters ranging from about 5-10 μm to about 100 μm. Specific examples of suitable aperture dimensions include circular apertures having diameters of 5-100 μm, square apertures having widths of 5-100 μm, and rectangular apertures having widths of 5-100 μm and lengths of 5-100 μm. As a specific example, rectangular apertures having dimensions of about 30×100 μm may be used to deposit pixels having the same or roughly the same dimensions. As previously described, multiple apertures may be used, and may be modeled as a single aperture having a cross-sectional area equal or comparable to the total cross-sectional area of the apertures for purposes of determining the conductance of a flow path through the apertures. For example, when using multiple apertures to deposit features such as pixels as previously described, a linear or two-dimensional array of apertures may be used. In some configurations, about 100-1000 apertures may be used. In a particular configuration, 100-1000 apertures having dimensions of $30\times100$ μm may be used (thus providing a total cross-sectional area of about $3\times10^6$-$3\times10^7$ $\mu m^2$) to deposit arrays of pixels or other features. Other dimensions may be used.

In general, the conductance through an aperture may be modeled as the ratio of the "gas throughput," i.e., the rate at which a volume of gas traverses the flow path, to the pressure difference between the regions on either side of the aperture. For short, approximately round apertures and pressures in the molecular flow regime (Knudsen's number less than 1), the conductance C is proportional to vA, where v is the average molecular velocity and A is the cross-sectional area of the aperture. As the aperture thickness increases, the cross-sectional area has a greater effect on the conductance. For a long, substantially round tube and molecular flow conditions, the conductance is proportional to $vd^3/L$, where d is the tube diameter and L is the length. Since OVJP systems as described herein typically operate within the molecular flow regime, the smallest cross-sectional area through which a flow path passes may be used as a reliable indicator of the relative conductance of one flow path relative to another flow path. Thus, a high-throughput OVJP system may be described in terms of the relationship between the cross-sectional area of the flow tube and the cross sectional area of the output apertures. It may be preferred for the flow tube to have a cross-sectional area that is at least about 100 times the cross-sectional area of the one or more apertures, more preferably at least about 200, and more preferably at least about 500 times the cross-sectional area of the apertures. For comparison purposes, the smallest aperture through which a particular flow path passes may act as the limiting factor of the conductance of the flow path. Thus, as previously described, the conductance of a flow path as described herein refers to the conductance through the smallest aperture or set of apertures through which the flow path passes. Other values of interest may include the average conductance of a flow path, which refers to the average of estimated or calculated conductances for each aperture or other enclosure through which the flow path passes; and the calculated conductance, which refers to a precisely-modeled or calculated conductance of the flow path.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A device comprising:

an enclosure having a first end, a second end, and at least one aperture disposed between the first end and the second end;

a source of organic molecules in fluid communication with the enclosure;

a source of carrier gas in fluid communication with the source of organic molecules;

a bypass valve;

a first flow path from the organic source through the bypass valve, the first flow path having a first conductance; and a second flow path from the organic source through the at least one aperture, the second flow path having a second conductance;

the first conductance being at least 100 times the second conductance when the bypass valve is open.

2. The device of claim 1, wherein the first conductance is zero when the bypass valve is closed.

3. The device of claim 1, wherein the source of organic molecules is disposed closer to the first end of the enclosed volume than the second end, and the bypass valve is disposed at the second end of the enclosed volume.

4. The device of claim 1 wherein, when the bypass valve is open, at least 95% of organic molecules produced by the source follow the first flow path.

5. The device of claim 4 wherein, when the bypass valve is open, at least 99.9% of organic molecules produced by the source follow the first flow path.

6. The device of claim 5 wherein, when the bypass valve is closed, at least 99.9% of organic molecules produced by the source follow the second flow path.

7. The device of claim 1, wherein the first conductance is at least 200 times greater than the second conductance.

8. The device of claim 1, wherein the first conductance is at least 500 times greater than the second conductance.

9. The device of claim 1, wherein the first conductance is at least 1000 times greater than the second conductance.

10. The device of claim 1, further comprising one or more nozzles attached to the at least one aperture.

11. The device of claim 10, wherein each of the one or more nozzles has a length of more than 0.5 cm.

12. The device of claim 10, wherein each of the one or more nozzles has a length of more than 0.1 cm.

13. The device of claim 10, wherein each of the one or more nozzles has a length in the range of 0.1 cm to 1 cm.

14. The device of claim 1, wherein the at least one aperture comprises a plurality of apertures, and the second flow path is from the organic source through the plurality of apertures.

15. The device of claim 14, wherein the plurality of apertures has a total cross-sectional area in the range of 3×105 μm2 to 3×106 μm2.

16. The device of claim 14, wherein the enclosure has a cross-sectional area at least 100 times the total cross-sectional area of the plurality of apertures.

17. The device of claim 14, wherein each of the apertures has a width of at least 5 to 10 μm.

18. The device of claim 14, wherein each of the apertures has a width in the range of 5 μm to 100 μm.

19. The device of claim 14, wherein each of the apertures has a cross-sectional area of 3000 μm2 or less.

20. The device of claim 1, further comprising a vacuum source in fluid communication with the second end of the enclosure.

21. The device of claim 1, further comprising a blocking mechanism moveable from a first position in which the blocking mechanism covers the at least one aperture to a second position in which the at least one aperture is uncovered.

22. The device of claim 1, wherein the blocking mechanism comprises at least one shutter, each shutter arranged to cover at least one aperture.

23. The device of claim 1, wherein the device has a lag time of not more than 1 minute when operated.

24. The device of claim 1, wherein the device has a lag time of not more than 1 second when operated.

25. A method of operating an organic vapor jet printing system having an enclosure, an organic source, a bypass valve, and at least one aperture disposed between the organic source and the bypass valve in the enclosure, the method comprising:

opening the bypass valve to cause the carrier gas flow to transport organic material from the organic source through a first flow path from the source through the bypass valve, the first flow path having a first conductance when the bypass valve is open; and closing the bypass valve to cause the carrier gas flow to transport organic material through a second flow path from the source through the at least one aperture, the second flow path having a second conductance;

the first conductance being at least 100 times the second conductance.

* * * * *